US009689945B2

(12) United States Patent
Nehrke et al.

(10) Patent No.: US 9,689,945 B2
(45) Date of Patent: Jun. 27, 2017

(54) VIRTUAL COIL EMULATION IN PARALLEL TRANSMISSION MRI

(75) Inventors: Kay Nehrke, Ammersbek (DE); Peter Boernert, Hamburg (DE)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 1150 days.

(21) Appl. No.: 13/816,305

(22) PCT Filed: Aug. 15, 2011

(86) PCT No.: PCT/IB2011/053611
§ 371 (c)(1),
(2), (4) Date: Feb. 11, 2013

(87) PCT Pub. No.: WO2012/023098
PCT Pub. Date: Feb. 23, 2012

(65) Prior Publication Data
US 2013/0134975 A1    May 30, 2013

(30) Foreign Application Priority Data
Aug. 20, 2010  (EP) .................................... 10173556

(51) Int. Cl.
*G01V 3/00* (2006.01)
*G01R 33/54* (2006.01)
(Continued)

(52) U.S. Cl.
CPC ....... *G01R 33/543* (2013.01); *G01R 33/5612* (2013.01); *G01R 33/5659* (2013.01)

(58) Field of Classification Search
CPC ................................................. G01R 33/5612
(Continued)

(56) References Cited

U.S. PATENT DOCUMENTS 7,221,160 B2  5/2007 Leussler et al.
7,525,313 B2  4/2009 Boskamp et al.
(Continued)

FOREIGN PATENT DOCUMENTS

WO    2008026174 A2    3/2008
WO    2009112987 A1    9/2009
(Continued)

OTHER PUBLICATIONS

Adriany, G., et al.; A Geometrically Adjustable 16-Channel Transmit/Receive Transmission Line Array for Improved RF Efficiency and Parallel Imaging Performance at 7 Tesla; 2008; MRM; 59:590-597.
(Continued)

*Primary Examiner* — Louis Arana (57) ABSTRACT

A virtual coil emulation method is used in a magnetic resonance imaging scan for acquiring a magnetic resonance image of an object (10). The scan is performed by an MR system (1) using a physical coil arrangement (9; 11; 12; 13) including a set of individual transmit coils. The coils are adapted for transmission of a desired RF transmit field to the object (10) for magnetic resonance spin excitation of the object (10). Each coil is associated with a physical transmit channel. The RF transmit field corresponds to a virtual arrangement of two or more of the coils. Virtual transmit channel properties include virtual transmit channel weights are assigned to the RF transmit field which describe the virtual complex RF field amplitudes with respect to each individual coil of the virtual coil arrangement to be applied to the physical coils (9; 11; 12; 13) for generating the RF transmit field.

20 Claims, 4 Drawing Sheets

(51) Int. Cl.
*G01R 33/561* (2006.01)
*G01R 33/565* (2006.01)

(58) Field of Classification Search
USPC ............................ 324/309, 307, 322, 318
See application file for complete search history.

(56) References Cited

U.S. PATENT DOCUMENTS

| | | | |
|---|---|---|---|
| 7,719,281 B2 | 5/2010 | Fontius et al. | |
| 2010/0244825 A1* | 9/2010 | Brau | G01R 33/5611 324/309 |
| 2011/0026799 A1 | 2/2011 | Nehrke et al. | |
| 2012/0007600 A1 | 1/2012 | Boernert et al. | |
| 2012/0179023 A1 | 7/2012 | Fuderer et al. | |
| 2012/0256626 A1* | 10/2012 | Adalsteinsson | G01R 33/5612 324/309 |
| 2013/0063143 A1* | 3/2013 | Adalsteinsson | G01R 33/5612 324/307 |
| 2014/0070804 A1* | 3/2014 | Huang | G01R 33/5611 324/309 |
| 2015/0091570 A1* | 4/2015 | Gross | G01R 33/5608 324/309 |
| 2016/0018498 A1* | 1/2016 | Boernert | G01R 33/5611 324/309 |

FOREIGN PATENT DOCUMENTS

| | | |
|---|---|---|
| WO | 2009128013 A1 | 10/2009 |
| WO | 2010113062 A1 | 10/2010 |
| WO | 2010113131 A1 | 10/2010 |

OTHER PUBLICATIONS

Alagappan, V, et al.; Degenerate Mode Band-Pass Birdcage Coil for Accelerated Parallel Excitation; 2007; MRM; 57:1148-1158.
Alagappan, V., et al.; Mode Compression of Transmit and Receive Arrays for Parallel Imaging at 7T; 2008; Proc. Intl. Soc. Mag. Reson. Med.; 16:619.
Celik, H., et al.; A Catheter Tracking Method Using Reverse Polarization for MR-Guided Interventions; 2007; MRM; 58:1224-1231.
Graesslin, I. et al.; Whole Body 3T MRI System with Eight Parallel RF Transmission Channels; 2006; Proc. Intl. Soc. Mag. Reson. Med.; 14:129.
Harvey, P. R., et al.; B1 Shimming Performance Versus Channel/Mode Count; 2010; Proc. ISMRM; 1 pg.
Katscher, U., et al.; Transmit SENSE; 2003; MRM; 49:144-150.
Nehrke, K., et al.; Eigenmode Analysis of Transmit Coil Array for Tailored B1 Mapping; 2010; MRM; 63:754-764.
Nehrke, K.; On the steady-state properties of actual flip angle imaging (AFI); 2009; MRM; 61:84-92.
Nehrke, K., et al.; Improved B1 Mapping for Multi RF Transmit Systems; 2008 Proc. Intl. Soc. Mag. Reson. Med.; 16:353.
Nehrke, K., et al.; Comparison of Whole Body Transmit Coil Configuration for RF Shimming at 3T; 2010; Proc. of ISMRM; 1 pg.
Nehrke, K., et al.; Eigenmode Analysis of Transmit Coil Array for SAR-reduced B1 Mapping and RF Shimming; 2009; Proc. Intl. Soc. Mag. Reson. Med.; 17:368.
Nistler, J., et al.; B1 homogenisation using a multichannel transmit array; 2006; Proc. Intl. Soc. Mag. Reson. Med.; 14:2471.
Orzada, S., et al.; 16-channel Tx/Rx body coil for RF shimming with selected CP modes at 7T; 2010; Proc. of ISMRM; 1 pg.
Setsompop, K., et al.; Magnitude least squares optimization for parallel radio frequency excitation design demonstrated at 7 Tesla with eight channels; 2008; MRM; 59(4)908-915.
Vernickel, P., et al.; Eight-Channel Transmit/Receive Body MRI Coil at 3T; 2007; MRM; 58:381-389.
Yarnykh, V. L.; Actual flip-angle imaging in the pulsed steady state: A method for rapid three-dimensional mapping of the transmitted radio frequency field; 2007; MRM; 57(1)192-200.
Zelinski, A. C., et al.; Sparsity-Enforced Coil Array Mode Compression for Parallel Transmission; 2008; Proc. Intl. Soc. Mag. Reson. Med.; 16:1302.
Zhu, Y.; Parallel Excitation with an Array of Transmit Coils; 2004; MRM; 51:775-784.
Blaimer et al "Virtual Coil Concept for Improved Parallel MRI Employing Conjugate Symmetric Signals" Magnetic Resonance in Med. vol. 61, R 93-102 (2009).
Buehrer et al "Array Compression for MRI With Large Coil Arrays" Magnetic Resonance in Med. vol. 57 p. 1131-1139 (2007).
Doneva et al "Automatic Coil Selection for Channel Reduction in Sense-Based Parallel Imaging" Magn. Reson. Mater Phys. vol. 21 p. 187-196 (2008).

* cited by examiner

VIRTUAL COIL EMULATION IN PARALLEL TRANSMISSION MRI

FIELD OF THE INVENTION

The invention relates to a method of performing a magnetic resonance imaging scan for acquiring a magnetic resonance image of an object, a magnetic resonance imaging (MRI) system adapted for performing a magnetic resonance imaging scan for acquiring a magnetic resonance image of an object, a virtual coil emulation method to be used in a magnetic resonance imaging scan for acquiring a magnetic resonance image of an object, a virtual coil emulation system and computer program products.

Image-forming magnetic resonance (MR) methods, which utilize the interaction between magnetic field and nuclear spins in order to form two-dimensional or three-dimensional images are widely used nowadays, notably in the field of medical diagnostics, because for the imaging of soft tissue they are superior to other imaging methods in many respects, they do not require ionizing radiation, and they are usually not invasive.

According to the MR method in general, the body of a patient or in general an object to be examined is arranged in a strong, uniform magnetic field $B_0$ whose direction at the same time defines an axis, normally the z-axis, of the coordinate system on which the measurement is based.

The magnetic field produces different energy levels for the individual nuclear spins in dependence on the applied magnetic field strength which spins can be excited (spin resonance) by application of an alternating electromagnetic radio frequency field (RF field) of defined frequency, the so called Larmor frequency or MR frequency. From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicularly to the z-axis, so that the magnetization performs a precessional motion about the z-axis.

Any variation of the magnetization can be detected by means of receiving RF antennas, which are arranged and oriented within an examination volume of the MR device in such a manner that the variation of the magnetization is measured in the direction perpendicularly to the z-axis.

In order to realize spatial resolution in the body, magnetic field gradients extending along the three main axes are superposed on the uniform magnetic field, leading to a linear spatial dependency of the spin resonance frequency. The signal picked up in the receiving antennas then contains components of different frequencies which can be associated with different locations in the body.

The signal data obtained via the receiving antennas corresponds to the spatial frequency domain and is called k-space data. The k-space data usually includes multiple lines acquired with different phase encoding. Each line is digitized by collecting a number of samples. A set of samples of k-space data is converted to an MR image, e.g. by means of Fourier transformation.

Thus it can be summarized, that coils play an important role in magnetic resonance imaging both with respect to transmission coils for application of RF excitation pulses to a spin system, and with respect to reception coils for receiving an RF response from the excited spin system.

BACKGROUND OF THE INVENTION

Parallel Transmission in MRI using a transmission coil array comprising a set of coils (for example 8, 16, 32 coils) represents an emerging technology, enabling a variety of interesting applications such as RF shimming and Transmit SENSE to improve the performance of MR especially at high field strengths (Katscher U et al. Magn Reson Med. 2003; 49(1):144-5; Zhu Y. Magn Reson Med. 2004; 51(4): 775-84). In this context, the transmit coil configuration is of crucial importance for the targeted parallel transmit application, and coil setups with different channel count or coil topology have been proposed (Vernickel P et al. Magn Reson Med. 2007; 58:381-9; Alagappan V et al. Magn Reson Med. 2007; 57:1148-1158; Adriany G et al. Magn Reson Med. 2008; 59:590-597).

However, the optimum coil concept represents a difficult trade-off between various important constraints as e.g. RF power efficiency, specific absorption rate (SAR) properties, time and performance constraints for B1 mapping and shimming with respect to the target application and anatomy.

Throughout this description, B1 mapping is understood as the method of determining transmission coil sensitivities of the transmission coils. Further, shimming is understood as the procedure of adjusting the transmission properties of these coils considering the acquired B1 maps in order to obtain a desired, for example homogeneous transmission profile within a certain spatial MR excitation area in the examination volume.

One example for the above mentioned trade-off between the various constraints is given by the requirement of good transmission coil shimming while ensuring that the SAR level exposed to an object to be imaged is kept at a small level: high quality coil shimming requires the acquisition of B1 maps for each individual coil, which in case of high numbers of transmission coils this requires a substantial amount of time and results in an undesired high SAR level exposed to the object to be imaged.

In practice, clinical parallel transmit applications based on many transmit channels (e.g. N=8) face a variety of problems, such as e.g. cumbersome workflow, difficult SAR control and limiting RF power constraints. For instance, RF shimming based on many transmit channels may result in shim settings with high RF power demands on some of the transmit channels, and hence, increased SAR values. This is due to the fact that some of the coil eigenmodes have little impact on the shimming result. Consequently, the shimmed RF pulses can only be played with low B1, limiting the clinical use for many applications. Regularization techniques can suppress these coil modes, however, this represents typically a careful tradeoff between shimming result and RF power/SAR, which cannot always be done in an automatic fashion. Moreover, the performance of the different coil modes may differ with respect to the target application and anatomy.

In order to provide a solution to this conflict, Nehrke K. and Börnert, P., "Eigenmode Analysis of Transmit Coil Array for Tailored B1 mapping", MRM 63:754-764 (2010) suggests to use virtual transmit coil arrays, since the linearity of the transmit chain allows the transmit sensitivity matrix to be measured with respect to any virtual coil array originating from superpositions of the actual coil elements via an appropriate transformation matrix. Thus, the linear properties of the MR transmit chain enable the concept of virtual transmit coils. In case the number of virtual coils is chosen to be smaller than the number of physical transmit coils, this virtual transmission coil concept permits performing an accelerated B1 mapping scan since B1 maps from a smaller number of virtual coil elements have to be acquired.

SUMMARY OF THE INVENTION

The present invention provides an improved method of performing a magnetic resonance imaging scan for acquiring a magnetic resonance image of an object, an improved magnetic resonance imaging (MRI) system adapted for performing a magnetic resonance imaging scan for acquiring a magnetic resonance image of an object, a improved virtual coil emulation method to be used in a magnetic resonance imaging scan for acquiring a magnetic resonance image of an object, a virtual coil emulation system and computer program products.

In accordance with the invention, a method of performing a magnetic resonance imaging scan for acquiring a magnetic resonance image of an object is provided, wherein the scan is performed using a physical coil arrangement comprising set of individual transmit coils, the coils being adapted for transmission of an RF transmit field to the object for magnetic resonance spin excitation of the object, wherein each coil is associated with a physical transmit channel, the method comprising:

a) selecting a desired RF transmit field to be generated by the coils, said RF transmit field corresponding to a virtual arrangement of two or more of said coils, wherein virtual transmit channel properties comprising virtual transmit channel weights are assigned to the RF transmit field, said virtual transmit channel weights describing the virtual complex RF field amplitudes with respect to each individual coil of the virtual coil arrangement required to be applied to the physical coils for generating the RF transmit field, b) transforming the virtual transmit channel properties using a channel encoding matrix, the transmit channel encoding matrix describing a transformation of the virtual transmit channel properties of the virtual coil arrangement to physical transmit channel properties of the physical coil arrangement, c) measuring individual virtual coil sensitivities of the two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity, d) optimizing the individual virtual transmit channel properties for each virtual coil using the measured virtual coil sensitivities in order to obtain the desired RF transmit field at higher accuracy, e) transforming the optimized virtual transmit channel properties using the channel encoding matrix, said transformation resulting in physical transmit channel properties comprising physical transmit channel weights, said physical transmit channel weights describing the physical complex RF field amplitudes with respect to each individual coil of the physical coil arrangement, f) performing the magnetic resonance imaging scan using the physical transmit channel properties.

Embodiments according to the invention have the advantage, that the method can be implemented in existing MR systems which are adapted for parallel RF field transmission without a need to modify the general system arrangement. This is due to the fact that the already existing MR system can keep its setup including its B1 mapping and shimming features, while the virtual coil concept can be implemented by a separate module. The already existing MR system can thus perform the already implemented operations like B1 mapping and shimming, while any additional features required for upgrading this system for employing the virtual coil concept can be exclusively limited to said additional separate module. Consequently, this can be used to increase robustness and speed of B1 mapping, to improve RF power and SAR control, and to simplify the workflow for parallel transmit applications.

In detail, in the prior art shimming was performed via a transformation of the virtual coil sensitivities to physical coil sensitivities and considering the physical coil sensitivities for the shimming process. In contrast, the present invention performs shimming using the virtual coil sensitivities only. No transformation of the virtual coil sensitivities is required for this purpose. Even though, this 'only' results in optimized individual virtual transmit channel properties while the prior art permitted to obtain optimized real physical transmit channel properties, the invention ensures that the method can be implemented in an already existing MR system which does not have to distinguish between virtual and physical coil arrangements. Thus, while in the prior art an already existing MR system had to be modified to distinguish between virtual coils and physical coils, according to the present invention a separate module can be provided which permits to implement the virtual coil concept without a need of significantly modifying the existing MR system.

In accordance with an embodiment of the invention, the physical and virtual transmit channel properties further or alternatively comprise time dependent RF pulse waveforms for each virtual coil, wherein the transformation of the virtual transmit channel properties and the optimized virtual transmit channel properties considers the time dependency of said RF pulse waveforms.

For example, in this embodiment the steps a) to e) are repeated for different desired RF transmit fields of an MR imaging sequence at different points in time, wherein in step f) the magnetic resonance imaging scan is performed using the physical transmit channel properties corresponding to the different desired RF transmit fields at the different points in time. Consequently, this permits to optimize the provision of RF power and SAR control exactly tailored to the design of individual pulse sequences: for example depending on the purpose of the individual RF pulses of the pulse sequence used for the imaging scan, the physical transmit channel properties may be changed. In an embodiment, the 'purpose' of RF pulses may include inversion recovery, saturation, regional or global suppression of chemical species like fat or T2 preparation.

In accordance with an embodiment of the invention optimizing the individual virtual transmit channel property for each virtual coil using the measured virtual coil sensitivities is performed in order to obtain the desired RF transmit field at higher spatial homogeneity at the object to be imaged.

In accordance with a further embodiment of the invention, the method further comprises determining a transmit channel encoding matrix, wherein said determination is performed by mathematical simulation of the desired RF transmit field considering the presence of the object to be imaged (for example employing am object atlas describing the electromagnetic field distribution in the object to be imaged or in general a body atlas of the human body to be imaged) and/or direct a priori measurements of the physical transmit coil sensitivities of the coils and/or determination of RF reception properties of the coils and calculation of the physical transmit coil sensitivities of the coils from the reception properties.

This permits to perform MR imaging in a faster manner since the virtual coil arrangement can be chosen in accordance with the real 'imaging conditions' within the examination volume of the MR scanner even in presence of the object to be imaged. Typically, the transmitted RF field in the examination volume strongly depends on the target application and anatomy of the object to be imaged. By choosing an appropriate transmit channel encoding matrix as described above, the real actual requirements regarding a desired RF transmission field distribution at the target object (like for example a human body) can be accommodated thus improving the respective shimming procedure.

In accordance with a further embodiment of the invention, the method is performed by a controller of a magnetic resonance imaging system, wherein the controller comprises a methods component, a virtual coil emulation component and a driver component, wherein the methods component controls performing steps a), c), d) and f) and the virtual coil emulation component controls performing steps b) and e), wherein the methods component controls the driver component via the virtual coil emulation component for driving the coils, wherein the virtual coil emulation component emulates the presence of only the virtual coil arrangement to the methods component.

In other words, it is proposed to insert an emulation layer into the MRI system to serve as an interface between methods software and basic hardware related software. This allows for mapping from the N' virtual channels of the freely chosen virtual coil array seen by the methods software to the N physical channels b of the actual coil array, resulting in a flexible implementation for a given system platform.

Preferably, the virtual coil arrangement emulated to the methods component comprises a number of virtual coils. For example, the number of virtual coils may depend on the object, in particular a target anatomy to be imaged, and/or the desired imaging sequence used for performing the magnetic resonance imaging scan and/or a desired coil type to be used for performing the magnetic resonance imaging scan and/or an authentication of the user of the controller.

In practice, for a corresponding encoding matrix, pre-defined matrices for different applications (e.g. RF shimming, Transmit SENSE), different anatomies (e.g. body, head, extremities), hardware platforms (channel count and topology of transmit coil) and users (research user, clinical user) may be stored on the system. In addition, usage of the different virtual coil arrays could be controlled/limited via product/research dongles. Furthermore, the SAR control may be simplified by locking certain coil arrangements for certain applications, i.e. the number of virtual coils may depend on a maximum specific absorption rate level to be exposed to the object.

A further application may be a gradual unlocking of virtual coils. For example, a user may obtain an MR system comprising 8 physical coils but only with a license for using a maximum of 5 coils simultaneously. Thus, a maximum of 5 virtual coils will be emulated towards to user. In another example, in case of an 8 transmission channel system in which one channel is defect, still 8 virtual channels may be emulated by using an appropriate superposition of the remaining 7 physical channels.

In another aspect, the invention relates to a magnetic resonance imaging system adapted for performing a magnetic resonance imaging scan for acquiring a magnetic resonance image of an object, wherein the system comprises a physical coil arrangement comprising set of individual transmit coils adapted to perform the scan, the coils being adapted for transmission of an RF transmit field to the object for magnetic resonance spin excitation of the object, wherein each coil is associated with a physical transmit channel, the system being adapted for:

a) selecting a desired RF transmit field to be generated by the coils, said RF transmit field corresponding to a virtual arrangement of two or more of said coils, wherein virtual transmit channel properties comprising virtual transmit channel weights are assigned to the RF transmit field, said virtual transmit channel weights describing the virtual complex RF field amplitudes with respect to each individual coil of the virtual coil arrangement required to be applied to the physical coils for generating the RF transmit field, b) transforming the virtual transmit channel properties using a channel encoding matrix, the transmit channel encoding matrix describing a transformation of the virtual transmit channel properties of the virtual coil arrangement to physical transmit channel properties of the physical coil arrangement, c) measuring individual virtual coil sensitivities of the two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity, d) optimizing the individual virtual transmit channel properties for each virtual coil using the measured virtual coil sensitivities in order to obtain the desired RF transmit field at higher accuracy, e) transforming the optimized virtual transmit channel properties using the channel encoding matrix, said transformation resulting in physical transmit channel properties comprising physical transmit channel weights, said physical transmit channel weights describing the physical complex RF field amplitudes with respect to each individual coil of the physical coil arrangement, f) performing the magnetic resonance imaging scan using the physical transmit channel properties.

In accordance with an embodiment of the invention, the system further comprises a controller for controlling steps a) to f), wherein the controller comprises a methods component, a virtual coil emulation component and a driver component, wherein the methods component is adapted for controlling steps a), c), d) and f) and the virtual coil emulation component is adapted for controlling performing steps b) and e), wherein the methods component is adapted for controlling the driver component via the virtual coil emulation component for driving the coils, wherein the virtual coil emulation component is adapted for emulating the presence of only the virtual coil arrangement to the methods component.

In another aspect, the invention relates to a computer program product comprising computer executable instructions to perform the method steps described above.

In another aspect, the invention relates to a virtual coil emulation method to be used in a magnetic resonance imaging scan for acquiring a magnetic resonance image of an object, wherein the scan is performed by an MR system using a physical coil arrangement comprising set of individual transmit coils, the coils being adapted for transmission of a desired RF transmit field to the object for magnetic resonance spin excitation of the object, wherein each coil is associated with a physical transmit channel, wherein the RF transmit field corresponds to a virtual arrangement of two or more of said coils, wherein virtual transmit channel properties comprising virtual transmit channel weights are assigned to the RF transmit field, said virtual transmit channel weights describing the virtual complex RF field amplitudes with respect to each individual coil of the virtual coil arrangement required to be applied to the physical coils for generating the RF transmit field, the method comprising:

a) receiving the virtual transmit channel properties from the MR system, b) transforming the virtual transmit channel properties using a channel encoding matrix, the transmit channel encoding matrix describing a transformation of the virtual transmit channel properties of the virtual coil arrangement to physical transmit channel properties of the physical coil arrangement, c) receiving optimized virtual transmit channel properties, the optimized virtual transmit channel properties being received from the MR system and resulting from     i. measuring by the MR system individual virtual coil sensitivities of the two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity,     ii. optimizing by the MR system the individual virtual transmit channel properties for each virtual coil using the measured virtual coil sensitivities resulting in the desired RF transmit field at higher accuracy, d) transforming the optimized virtual transmit channel properties using the channel encoding matrix, said transformation resulting in physical transmit channel properties comprising physical transmit channel weights, said physical transmit channel weights describing the physical complex RF field amplitudes with respect to each individual coil of the physical coil arrangement, e) providing the physical transmit channel properties to the MR system for performing the magnetic resonance imaging scan using the physical transmit channel properties.

In another aspect, the invention relates to a virtual coil emulation system adapted to be used in a magnetic resonance imaging scan for acquiring a magnetic resonance image of an object, wherein the scan is performed by an MR system using a physical coil arrangement comprising set of individual transmit coils, the coils being adapted for transmission of a desired RF transmit field to the object for magnetic resonance spin excitation of the object, wherein each coil is associated with a physical transmit channel, wherein the RF transmit field corresponds to a virtual arrangement of two or more of said coils, wherein virtual transmit channel properties comprising virtual transmit channel weights are assigned to the RF transmit field, said virtual transmit channel weights describing the virtual complex RF field amplitudes with respect to each individual coil of the virtual coil arrangement required to be applied to the physical coils for generating the RF transmit field, the emulation system being adapted for:

f) receiving the virtual transmit channel properties from the MR system, g) transforming the virtual transmit channel properties using a channel encoding matrix, the transmit channel encoding matrix describing a transformation of the virtual transmit channel properties of the virtual coil arrangement to physical transmit channel properties of the physical coil arrangement, h) receiving optimized virtual transmit channel properties, the optimized virtual transmit channel properties being received from the MR system and resulting from     i. measuring by the MR system individual virtual coil sensitivities of the two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity,     ii. optimizing by the MR system the individual virtual transmit channel properties for each virtual coil using the measured virtual coil sensitivities resulting in the desired RF transmit field at higher accuracy, i) transforming the optimized virtual transmit channel properties using the channel encoding matrix, said transformation resulting in physical transmit channel properties comprising physical transmit channel weights, said physical transmit channel weights describing the physical complex RF field amplitudes with respect to each individual coil of the physical coil arrangement, j) providing the physical transmit channel properties to the MR system for performing the magnetic resonance imaging scan using the physical transmit channel properties.

In another aspect, the invention relates to a computer program product comprising computer executable instructions to perform the method steps of the virtual coil emulation method.

BRIEF DESCRIPTION OF THE DRAWINGS

In the following, preferred embodiments of the invention are described in greater detail by way of example only. Thus, the following drawings are designed for the purpose of illustration only and not as a definition of the limits of the invention. In the drawings.

DETAILED DESCRIPTION OF EMBODIMENTS

Figure 1:
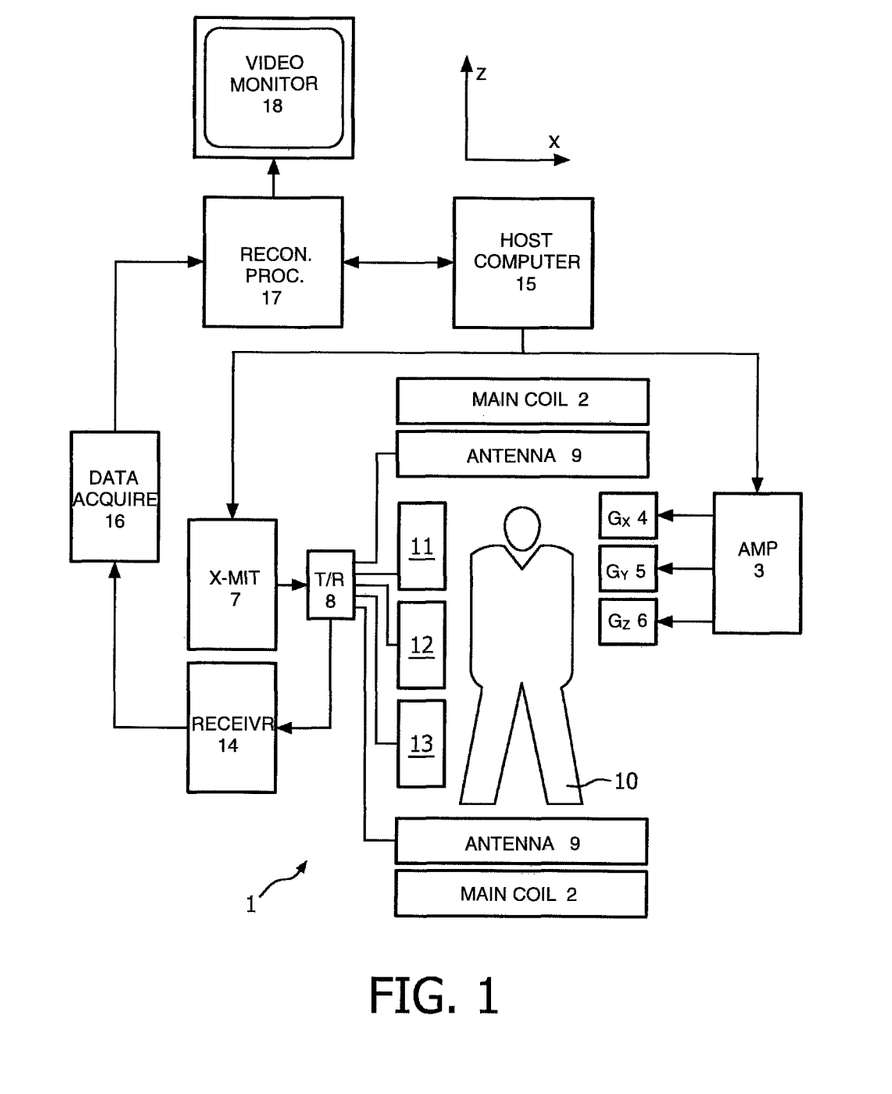
FIG. 1 shows a schematic of an MR system for implementation of the coil arrangement according to the invention.

With reference to FIG. 1, a schematic of an MR imaging system 1 is shown.

The system comprises superconducting or resistive main magnet coils 2 such that a substantially uniform, temporarily constant main magnetic field B0 is created along a z-axis through an examination volume.

A magnetic resonance generation manipulation system applies a series of RF pulses and switched magnetic field gradients to invert or excite nuclear magnetic spins, induce magnetic resonance, refocus magnetic resonance, manipulate magnetic resonance, spatially or otherwise encode the magnetic resonance, saturate spins and the like to perform MR imaging.

More specifically, a gradient pulse amplifier 3 applies current pulses to selected ones of whole body gradient coils 4, 5 and 6 along x, y and z-axes of the examination volume. An RF transmitter 7 transmits RF pulses or pulse packets, via a send/receive switch 8 to an RF antenna 9 to transmit RF pulses into the examination volume. A typical MR imaging sequence is composed of a packet of RF pulse sequences of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals may also be picked up by the RF antenna 9.

For generation of MR images of limited regions of the body or in general object 10, for example by means of parallel imaging, a set of local array RF coils 11, 12 and 13 are placed contiguous to the region selected for imaging. The array coils 11, 12 and 13 can be used to receive MR signals induced by RF transmissions effected via the RF antenna. However, it is also possible to use the array coils 11, 12 and 13 to transmit RF signals to the examination volume.

Even though, above only a single RF transmitter 7, send/receive switch 8 and antenna 9 were presented, according to the present invention this has to be understood as an arrangement of multiple RF transmitters 7, corresponding switches 8 and corresponding antennas 9, i.e. a physical coil arrangement comprising set of individual transmit coils and associated transmit channels.

The resultant MR signals are picked up by the RF antenna 9 and/or by the array of RF coils 11, 12 and 13 and are demodulated by a receiver 14 preferably including a pre-amplifier (not shown). The receiver 14 is connected to the RF coils 9, 11, 12 and 13 via a send/receive switch 8.

A host computer 15 controls the gradient pulse amplifier 3 and the transmitter 7 to generate any of a plurality of imaging sequences, such as echo planar imaging (EPI), echo volume imaging, gradient and spin echo imaging, fast spin echo imaging and the like.

For the selected sequence, the receiver 14 receives a single or a plurality of MR data lines in a rapid succession following each RF excitation pulse. A data acquisition system 16 performs analogue to digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume or the like. The image is then stored in an image memory where it may be accessed for converting slices or other portions of the image representation into appropriate formats for visualization, for example via a video monitor 18 which provides a man readable display of the resultant MR image.

Figure 2A:
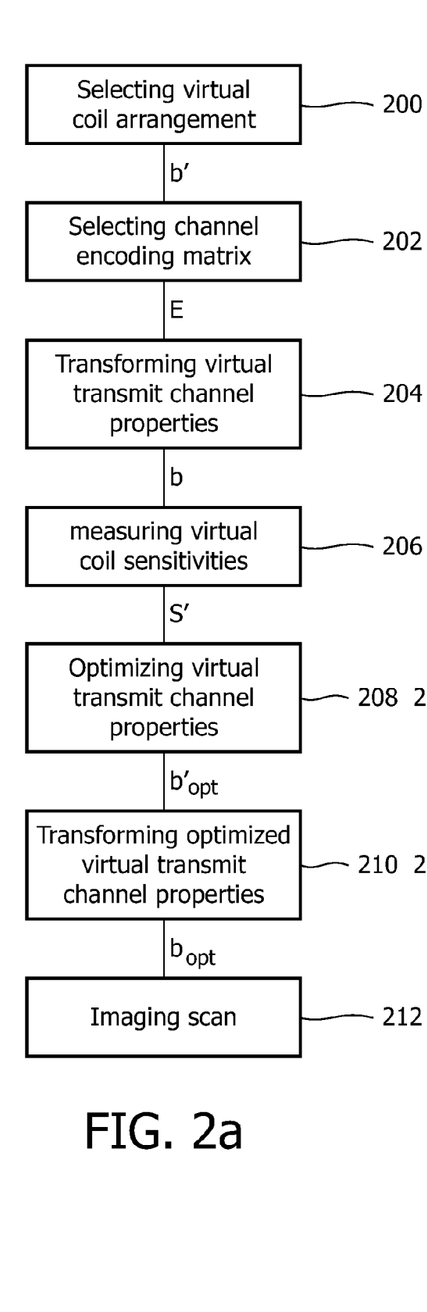
FIG. 2 illustrates a flowchart of the method according to the invention.
Figure 2B:
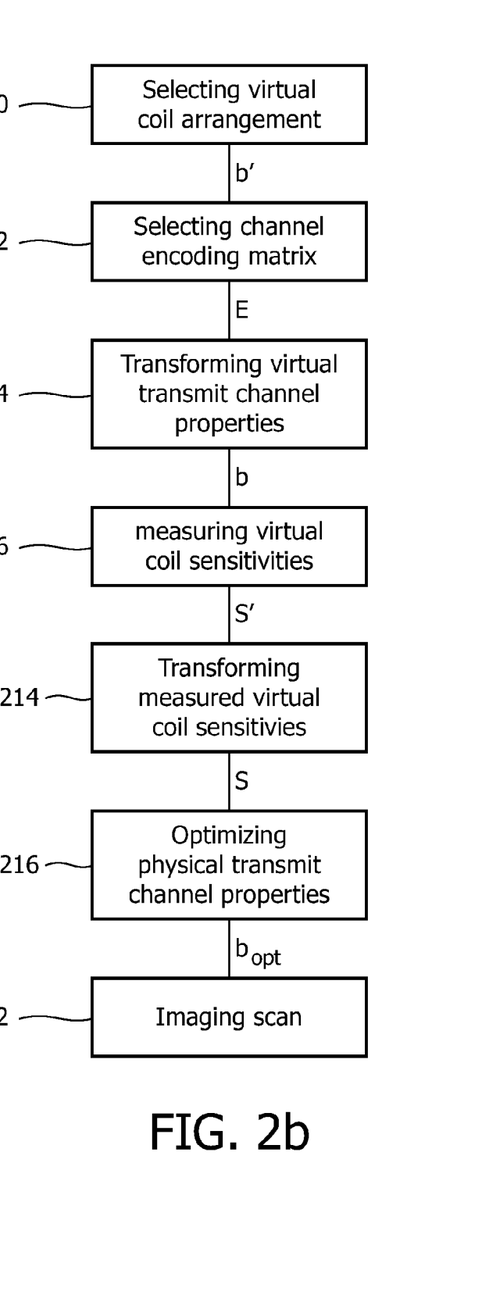

FIG. 2 is a flowchart comparing the above described method of performing MR imaging (FIG. 2a) using a virtual coil arrangement with the according state of the art approach (FIG. 2b). In order to understand the concept more deeply, the following basics have to be considered:

In parallel transmit applications, a coil array is used to generate the B1 transmit field. Thus, the total effective B1 transmit field represents a superposition of the fields generated by the N individual coils of the array, $$B_1(r, t) = \sum_{n=1}^{N} S_n(r) b_n(t) \quad [1]$$

where $S_n(r)$ denotes the actual spatial transmit sensitivity of the n-th transmit coil, and $b_n(t)$ indicates the corresponding driving waveform. Advanced parallel transmit applications like e.g. Transmit SENSE (Katscher U et al. Magn Reson Med. 2003; 49(1):144-5; Zhu Y. Magn Reson Med. 2004; 51(4):775-84) employ independent waveforms per channel for acceleration of RF pulses or improved pulse performance. A simpler, but currently clinically more relevant transmit application is RF shimming, where stationary complex channel weights $b_n$ are employed to achieve a spatially uniform B1, $$B_1(r, t) = w(t) \sum_{n=1}^{N} S_n(r) b_n \quad [2]$$

where w(t) denotes the common RF pulse waveform used for e.g. slice selection. In this way, dielectric shading artifacts typical for MRI at higher field strengths (≥3 T) may be compensated for.

Since the transmit sensitivities are patient-dependent, B1 mapping has to be performed prior to the parallel transmit application to determine the transmit sensitivity of each individual coil element. Utilizing the non-linearity of the Bloch equations, B1 maps may be derived from two or more MR images acquired for different flip angles, echoes or repetition times (see references in Nehrke K. Magn Reson Med 2009; 61:84-92), which is a time consuming procedure. Moreover, the typically large dynamic range of the coil sensitivities challenges MR-based B1 mapping, which inherently suffers from adverse error propagation at small flip-angles.

The linear properties of the MR transmit chain enable the concept of virtual coil arrays. Hence, a channel encoding Matrix E may be used to map from N' virtual transmit channels to the N actual transmit channels of the physical coil array:

$$b = E \cdot b', \ E = (e_{ij})_{N' \times N} \quad [3]$$

where b denotes the transmit channel weights written as column vector. Accordingly, the resulting virtual transmit channels correspond to virtual coil sensitivities S':

$$S' = S \cdot E \quad [4]$$

where S denotes the coil sensitivities of the physical coil array written as matrix (rows: voxels, columns: channels). To improve the performance of B1 mapping, the encoding matrix can be tailored to optimize the dynamic range and complementarity of the individual virtual coil sensitivities. To accelerate B1 mapping, an encoding matrix with N'<N can be chosen to sort out coil modes with little impact on the shimming result (7). This typically results also in an increased B1 efficiency, and hence, reduced SAR. Moreover, the RF shimming procedure, which is typically based on numerically expensive magnitude least-squares fitting, becomes faster and more robust, as a result of the reduced degrees of freedom. The encoding matrix can be chosen based on a-priori knowledge (e.g. target application and anatomy) and refined by patient-specific calibration using information from e.g. survey scans.

In the flowchart of FIG. 2a, the above described method of performing MR imaging using a virtual coil arrangement is illustrated. The method starts in step 200 a) with selecting a desired RF transmit field to be generated by the coils, said RF transmit field corresponding to a virtual arrangement of two or more of said coils, wherein virtual transmit channel weights b' are assigned to the RF transmit field. It has to be noted, that even though FIG. 2 only considers virtual transmit channel weights, the concept is meant to be extendable also generally to virtual transmit channel properties including virtual transmit channel weights and time dependent RF pulse waveforms w(t).

In step 202, an appropriate channel encoding matrix E is selected, which is followed by step 204 in which the virtual transmit channel weights b' are transformed using a channel encoding matrix E, which results in b.

In the subsequent step 206, the individual virtual coil sensitivities S' of the two or more virtual coils are measured using the respective transformed individual virtual transmit channel property b for each virtual coil.

In the next step 208, the individual virtual transmit channel weights are optimized for each virtual coil using the measured virtual coil sensitivities in order to obtain the desired RF transmit field at higher accuracy. This results in optimized virtual transmit channel weights b'.

Subsequently, in step 210 the optimized virtual transmit channel weights b' are transformed using the channel encoding matrix E, said transformation resulting in physical transmit channel weights b.

Finally, in step 212 the desired magnetic resonance imaging scan is performed using the physical transmit channel weights.

In contrast, in the prior art approach (FIG. 2b), only steps 200-206 and 212 are identical with the approach according to the invention. Significant differences exist with respect to steps 208 and 210 which are substituted in the prior art by respective steps 214 and 216: After having measured the virtual coil sensitivities S' in step 106, in FIG. 2b the virtual coil sensitivities S' are transformed using the matrix E, which results in physical coil sensitivities S. Then, in step 216 the individual physical transmit channel weights b are optimized for each virtual coil using the measured physical coil sensitivities S in order to obtain the desired RF transmit field at higher accuracy. This results in optimized physical transmit channel weights b.

This has the following consequences for a practical implementation of the prior art approach in a given MR system platform which is already capable of performing a multi channel RF transmission: the platform typically performs steps 200, 206, 216 and 212 using a physical coil arrangement only. I.e. in step 200 a respective physical coil arrangement is selected.

When providing the virtual coil arrangement capabilities to the system platform, the system platform additionally has to recognize in step 206 that the measured coil sensitivities are virtual coil sensitivities and instruct a respective software addon providing the virtual coil setup to perform step 214. As a consequence, the system platform has to be modified accordingly, either in hardware or software to perform this step.

In contrast, following the approach in FIG. 2a, a software (or hardware) emulation layer can be provided which permits the system platform to remain unchanged. Instead of performing step 214, the system platform performs step 208 without a need to distinguish between virtual coil arrangements and physical coil arrangements.

Figure 3:
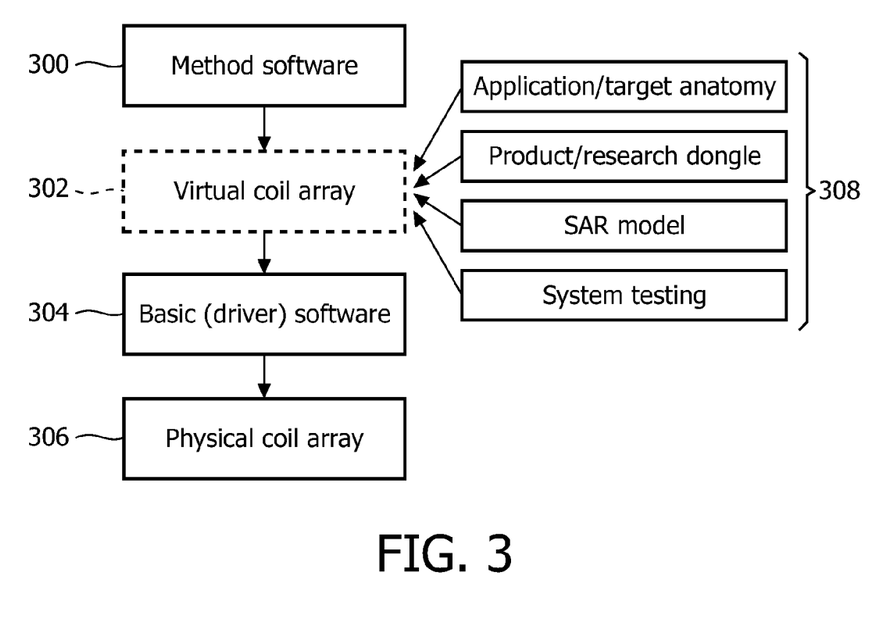
FIG. 3 illustrates the usage of a software emulation layer.

This will become even more clear when considering the layer approach discussed with respect to FIG. 3.

To realize the virtual coil concept on a clinical scanner, an emulation layer 302 is inserted into the MRI system to serve as an interface between methods software 300 and basic hardware 304 related software used for controlling the physical coil array 306. This allows for mapping from the N' virtual channels b' of the freely chosen virtual coil array seen by the methods software to the N physical channels b of the actual coil array (cf. Eq. 3), resulting in a flexible implementation for a given system platform (FIG. 3). As denoted by reference numeral 308, for the corresponding encoding matrix E, predefined matrices for different applications (e.g. RF shimming, Transmit SENSE), different anatomies (e.g. body, head, extremities), hardware platforms (channel count and topology of transmit coil) and users (research user, clinical user) are stored on the system. In addition, usage of the different virtual coil arrays could be controlled/limited via product/research dongles. Furthermore, the SAR control may be simplified by locking certain coil modes for certain applications.

Figure 4:
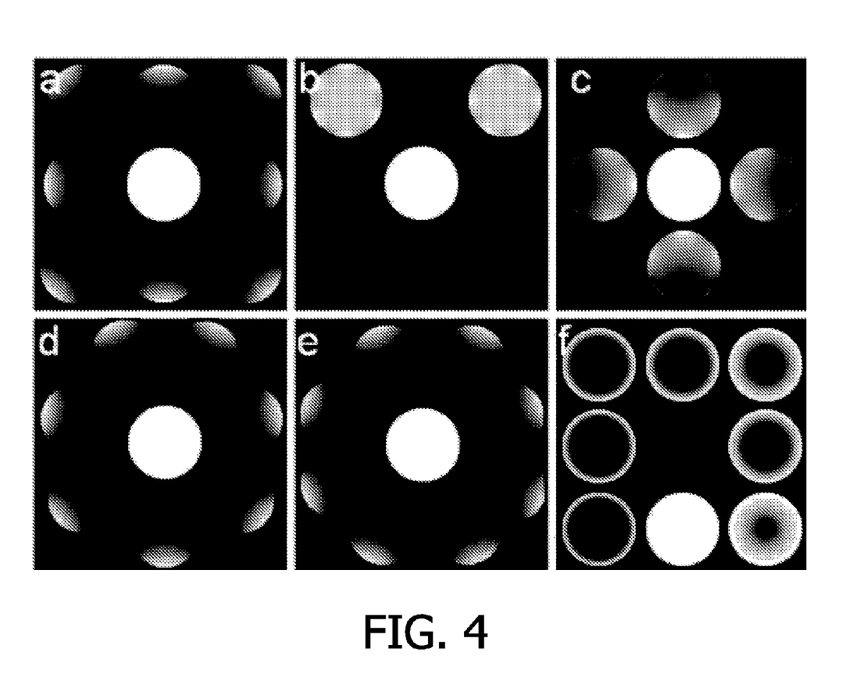
FIG. 4 illustrates simulations of different virtual coil configurations.

FIG. 4 illustrates simulations of different coil configurations: vacuum B1 sensitivities are shown for an 8-channel TEM coil (a), which were used to emulate different coil configurations (b: 2-port birdcage, c: 4-port birdcage, d: 7-channel coil, e: 8-channel coil rotated by 360°/16, f: 8-channel coil driven by Butler-Matrix. The flat maps shown in the center (a-e) correspond to the sum of all virtual channels, demonstrating pure quadrature excitation. The maps of the 8-channel TEM coil were simulated for a chosen set of geometry parameters (coil radius R=0.3 m, shield radius RS=0.32 m, field-of-view radius RFOV=0.2 m).

In detail, a 3 T MRI system (Philips Healthcare, Best, The Netherlands) equipped with eight transmit channels (Grasslin I et al., ISMRM 2006, p. 129) and an 8-element TX/RX TEM body coil (Vernickel P et al. Magn Reson Med. 2007; 58:381-9) has been employed. The corresponding coil sensitivities are shown in FIG. 4a. A software emulation layer has been inserted into the system as an interface between the method software and the basic hardware-related software. This allows for the mapping of N' freely chosen virtual TX/RX channels seen by the scan software to N physical TX/RX channels via an adjustable encoding matrix E (cf. Eq.3). Hence, virtual coils may be derived from the physical coils by linear superposition. As an example, a 2-port birdcage coil has been emulated, employing encoding matrices with the structure:

$$E = F_1^{-1} \cdot \Gamma \cdot F_2 \quad [5]$$

where $\Gamma = (\gamma_{\kappa\lambda})_{N \times N}$ represents a diagonal matrix for selecting and weighting the different eigenmodes. In case of a 2-port birdcage, only the quadrature and the anti-quadrature modes are selected by setting $\gamma_{11} = \gamma_{77} = 1$ and nulling the remaining entries of $\Gamma$. Furthermore, $F_1$ and $F_2$ are Fourier matrices transforming from the N=8 actual and N'=2 virtual transmit channels, respectively, to the coil eigenmodes:

$$F_1 = (f_{1kl})_{N \times N} \text{ with } f_{1kl} = e^{2\pi i (k-1)(l-1)/N} \text{ and } F_2 = (f_{2kl})_{N \times N'}$$
$$\text{with } f_{2kl} = e^{2\pi i (k-1)(l-1)S/N} \quad [6]$$

where S denotes the geometrical shift in terms of S·45° between successive virtual coil elements. The geometrical shift is determined by the symmetry of the modes, and is S=2 for the 2-port birdcage coil. The resulting encoding matrix reads:

$$E_{2\text{-port}}^T = \begin{pmatrix} 2 & 1-i & 0 & 1+i & 2 & 1-i & 0 & 1+i \\ 0 & 1+i & 2 & 1-i & 0 & 1+i & 2 & 1-i \end{pmatrix} \quad [7]$$

Figure 5:
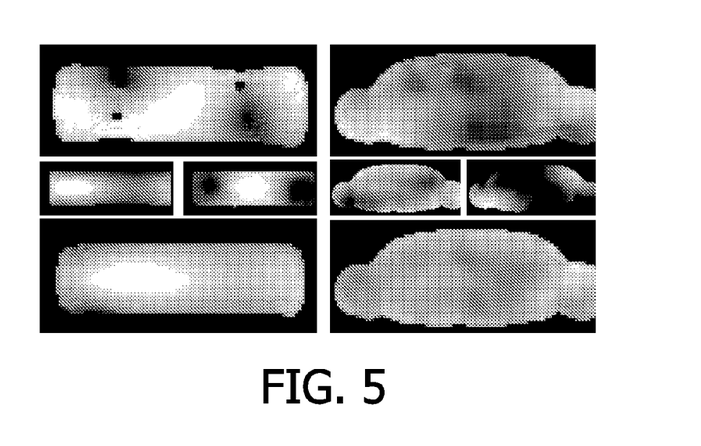
FIG. 5 shows various B1 maps.

The resulting two linearly polarized coil modes (FIG. 4b) were employed for $B_1$ mapping and RF shimming of body phantoms (water disk with 400 mm Ø in coronal orientation, FIG. 5 left) and volunteers (abdomen, FIG. 5 right).

In detail, in FIG. 5 RF shimming for an emulated 2-port birdcage is shown. B1 maps measured on phantoms (left) and in vivo (right) are shown for quadrature shim settings (top) and adapted shim settings (bottom). The adapted shim settings were derived from B1 maps measured for the two linearly polarized modes (centre), emulated for the employed 8-channel TEM coil. Note the strongly improved homogeneity in case of the adapted RF shim settings.

The AFI (Actual Flip Angle Imaging) technique (Yarnykh V L. Magn Reson Med 2007; 57:192-200) was used for $B_1$ mapping of the virtual coil modes (450×270×75 mm³ FOV, 64×38×5 matrix, angle=60°, $TR_1$=20 ms, $TR_2$=100 ms, TE=2.3 ms, transverse scan orientation, improved spoiling scheme (Nehrke K. Magn Reson Med 2009; 61:84-92), resulting in 18 seconds scan time per 3D $B_1$ map). For RF shimming, magnitude least square fitting of the maps was performed using a dedicated Java implementation of the local variable exchange method (Setsompop K et al. MRM 2008; 59:908-15).

For evaluation of the adapted shim settings, shimmed $B_1$ maps were acquired and compared with maps acquired with the default quadrature settings. Using the default quadrature shim settings of the system, the $B_1$ maps exhibit strong inhomogeneities of the RF field, resulting in shaded areas in the in vivo maps and signal voids in the phantom maps (FIG. 5). Using the adapted RF shim settings, the homogeneity is strongly improved for both, phantoms and in vivo $B_1$ maps. Note that the adapted shim settings are based on only two $B_1$ maps measured for the two linearly polarized modes of the emulated coil, in contrast to the eight physical coil elements present in the system.

Emulation of the 2-port birdcage could be beneficial for applications, where little impact of the omitted coil eigenmodes on the RF shimming result is expected, e.g. abdominal RF shimming at 3 T. Thus, B1 mapping would be accelerated and RF power/SAR would be reduced.

In close analogy to the embodiment discussed with respect to FIG. 4b, a 4-port birdcage coil has been emulated (FIG. 4c) by selecting four coil eigenmodes: $\gamma_{11}=\gamma_{22}=\gamma_{66}=\gamma_{77}=1$). The number of virtual coil elements is then N'=4 and the shift is S=2 (FIG. 4c).

The resulting encoding matrix reads:

$$E_{4-port}^T = \begin{pmatrix} 4 & 1-i & 2i & 1+i & 0 & 1-i & -2i & 1+i \\ -2i & 1+i & 4 & 1-i & 2i & 1+i & 0 & 1-i \\ 0 & 1-i & -2i & 1+i & 4 & 1-i & 2i & 1+i \\ 2i & 1+i & 0 & 1-i & -2i & 1+i & 4 & 1-i \end{pmatrix} \quad [8]$$

Emulation of the 4-port birdcage could be beneficial for applications, where little impact of the omitted coil eigenmodes on the RF shimming result is expected. Thus, B1 mapping would be accelerated and RF power/SAR would be reduced.

Similar to the embodiment discussed with respect to FIG. 4b, a 7-channel coil has been emulated (FIG. 4d) by selecting seven eigenmodes of the 8-channel TEM coil: ($\gamma_{11}=\gamma_{22}=\gamma_{33}=\gamma_{44}=\gamma_{55}=\gamma_{66}=\gamma_{77}=1$). The number of virtual coil elements is then N'=7 and the shift is S=8/7. In this particular configuration, the common mode ($\gamma_{77}$) has been omitted, which has only little impact on the RF shim result, but adds considerably to the RF power and SAR.

A rotated 8-channel coil (rotation angle α) has been emulated by applying a linear phase to the coil eigenmodes ($\gamma_{kk}=\exp(2\pi i(k-1)\phi)$). This can be used to align a symmetry axis of the coil array to a symmetry axis of the body (e.g. left-right or anterior-posterior) to achieve simple symmetry properties between receive and transmit shims.

By replacing $F_1$ and $\Gamma$ in Eq. 5 by identity matrices, a transformation from the loop-ordered physical coil elements to the coil eigenmodes is achieved (FIG. 4a,f), which is the software equivalent to the so-called Butler matrix (Alagappan V. MRM 2007; 57: 1148-58). This can be even more generalized using arbitrary but appropriate transformation matrices E.

Formally, it is also possible to use more virtual transmit channel than physical transmit channels are available (N'>N) by interpolating between coil modes. For instance, an 8-channel coil can be emulated on a 2-port birdcage by simply transposing the encoding matrix given in Eq. 7. This can be used to improve the stability of B1 mapping, representing a smart way of averaging with NSA=4. In addition, the workflow for 8-transmit channels could be tested on a physical 2-channel system.

The proposed approach may be used to switch a coil array into the anti-quadrature mode. This could be useful for e.g. device tracking using inductively coupled RF receive coils (Celik H et al. Magn Reson Med. 2007; 58:1224-31).

The proposed approach may be used for other coil topologies (e.g. rectangular transmit arrays), using appropriate encoding matrices. For instances, the Fourier-based mode decomposition (cf. Eq.5) could be generalized to a Singular Value Decomposition (SVD) to derive coil "eigenmodes" in the general case.

The proposed approach could also be applied to receive coil arrays for e.g. improved Parallel Imaging (e.g. data reduction).

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of performing a magnetic resonance imaging scan for acquiring a magnetic resonance image of an object, wherein the scan is performed using a physical coil arrangement comprising set of individual transmit coils, the coils being adapted for transmission of an RF transmit field to the object for magnetic resonance spin excitation of the object, wherein each coil is associated with a physical transmit channel, the method comprising:
   a) selecting a desired RF transmit field to be generated by the coils, said RF transmit field corresponding to a virtual arrangement of two or more of said coils, wherein virtual transmit channel properties comprising virtual transmit channel weights are assigned to the RF transmit field, said virtual transmit channel weights describing the virtual complex RF field amplitudes with respect to each individual coil of the virtual coil arrangement required to be applied to the physical coils for generating the RF transmit field,
   b) transforming the virtual transmit channel properties using a channel encoding matrix, the transmit channel encoding matrix describing a transformation of the virtual transmit channel properties of the virtual coil arrangement to physical transmit channel properties of the physical coil arrangement,
   c) measuring individual virtual coil sensitivities of the two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity, d) optimizing the individual virtual transmit channel properties for each virtual coil using the measured virtual coil sensitivities in order to obtain the desired RF transmit field at higher accuracy, e) transforming the optimized virtual transmit channel properties using the channel encoding matrix, said transformation resulting in physical transmit channel properties comprising physical transmit channel weights, said physical transmit channel weights describing the physical complex RF field amplitudes with respect to each individual coil of the physical coil arrangement, f) performing the magnetic resonance imaging scan using the physical transmit channel properties.

2. The method of claim 1, wherein the physical and virtual transmit channel properties further or alternatively comprise time dependent RF pulse waveforms for each virtual coil, wherein the transformation of the virtual transmit channel properties and the optimized virtual transmit channel properties considers the time dependency of said RF pulse waveforms.

3. The method of claim 2, wherein the steps a) to e) are repeated for different desired RF transmit fields of an MR imaging sequence at different points in time, wherein in step f) the magnetic resonance imaging scan is performed using the physical transmit channel properties corresponding to the different desired RF transmit fields at the different points in time.

4. The method of claim 1, wherein optimizing the individual virtual transmit channel property for each virtual coil using the measured virtual coil sensitivities in order to obtain the desired RF transmit field at higher spatial homogeneity at the object to be imaged.

5. The method of claim 1, further comprising determining a transmit channel encoding matrix, wherein said determination is performed by mathematical simulation of the desired RF transmit field considering the presence of the object to be imaged and/or direct a priori measurements of the physical transmit coil sensitivities of the coils and/or determination of RF reception properties of the coils and calculation of the physical transmit coil sensitivities of the coils from the reception properties.

6. The method of claim 1, wherein the method is performed by a controller of a magnetic resonance imaging system, wherein the controller comprises a methods component, a virtual coil emulation component and a driver component, wherein the methods component controls performing steps a), c), d) and f) and the virtual coil emulation component controls performing steps b) and e), wherein the methods component controls the driver component via the virtual coil emulation component for driving the coils, wherein the virtual coil emulation component emulates the presence of only the virtual coil arrangement to the methods component.

7. The method of claim 6, wherein the virtual coil arrangement emulated to the methods component comprises a number of virtual coils.

8. The method of claim 7, wherein the number of virtual coils depends on the object, in particular a target anatomy to be imaged, and/or the desired imaging sequence used for performing the magnetic resonance imaging scan and/or a desired coil type to be used for performing the magnetic resonance imaging scan and/or an authentication of the user of the controller.

9. The method of claim 7, wherein the number of virtual coils depends on a maximum specific absorption rate level to be exposed to the object.

10. A magnetic resonance imaging system adapted for performing a magnetic resonance imaging scan for acquiring a magnetic resonance image of an object, wherein the system comprises a physical coil arrangement comprising set of individual transmit coils adapted to perform the scan, the coils being adapted for transmission of an RF transmit field to the object for magnetic resonance spin excitation of the object, wherein each coil is associated with a physical transmit channel, the system being adapted for:

a) selecting an desired RF transmit field to be generated by the coils, said RF transmit field corresponding to a virtual arrangement of two or more of said coils, wherein virtual transmit channel properties comprising virtual transmit channel weights are assigned to the RF transmit field, said virtual transmit channel weights describing the virtual complex RF field amplitudes with respect to each individual coil of the virtual coil arrangement required to be applied to the physical coils for generating the RF transmit field, b) transforming the virtual transmit channel properties using a channel encoding matrix, the transmit channel encoding matrix describing a transformation of the virtual transmit channel properties of the virtual coil arrangement to physical transmit channel properties of the physical coil arrangement, c) measuring individual virtual coil sensitivities of the two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity, d) optimizing the individual virtual transmit channel properties for each virtual coil using the measured virtual coil sensitivities in order to obtain the desired RF transmit field at higher accuracy, e) transforming the optimized virtual transmit channel properties using the channel encoding matrix, said transformation resulting in physical transmit channel properties comprising physical transmit channel weights, said physical transmit channel weights describing the physical complex RF field amplitudes with respect to each individual coil of the physical coil arrangement, f) performing the magnetic resonance imaging scan using the physical transmit channel properties.

11. The system of claim 10, further comprising a controller for controlling steps a) to f), wherein the controller comprises a methods component, a virtual coil emulation component and a driver component, wherein the methods component is adapted for controlling steps a), c), d) and f) and the virtual coil emulation component is adapted for controlling performing steps b) and e), wherein the methods component is adapted for controlling the driver component via the virtual coil emulation component for driving the coils, wherein the virtual coil emulation component is adapted for emulating the presence of only the virtual coil arrangement to the methods component.

12. A virtual coil emulation method to be used in a magnetic resonance imaging scan for acquiring a magnetic resonance image of an object, wherein the scan is performed by an MR system using a physical coil arrangement comprising set of individual transmit coils, the coils being adapted for transmission of a desired RF transmit field to the object for magnetic resonance spin excitation of the object, wherein each coil is associated with a physical transmit channel, wherein the RF transmit field corresponds to a virtual arrangement of two or more of said coils, wherein virtual transmit channel properties comprising virtual transmit channel weights are assigned to the RF transmit field, said virtual transmit channel weights describing the virtual complex RF field amplitudes with respect to each individual coil of the virtual coil arrangement required to be applied to the physical coils for generating the RF transmit field, the method comprising:
  a) receiving the virtual transmit channel properties from the MR system,
  b) transforming the virtual transmit channel properties using a channel encoding matrix, the transmit channel encoding matrix describing a transformation of the virtual transmit channel properties of the virtual coil arrangement to physical transmit channel properties of the physical coil arrangement,
  c) receiving optimized virtual transmit channel properties, the optimized virtual transmit channel properties being received from the MR system and resulting from
    i. measuring by the MR system individual virtual coil sensitivities of the two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity,
    ii. optimizing by the MR system the individual virtual transmit channel properties for each virtual coil using the measured virtual coil sensitivities resulting in the desired RF transmit field at higher accuracy,
  d) transforming the optimized virtual transmit channel properties using the channel encoding matrix, said transformation resulting in physical transmit channel properties comprising physical transmit channel weights, said physical transmit channel weights describing the physical complex RF field amplitudes with respect to each individual coil of the physical coil arrangement,
  e) providing the physical transmit channel properties to the MR system for performing the magnetic resonance imaging scan using the physical transmit channel properties.

13. A virtual coil emulation system adapted to be used in a magnetic resonance imaging scan for acquiring a magnetic resonance image of an object, wherein the scan is performed by an MR system using a physical coil arrangement comprising set of individual transmit coils, the coils being adapted for transmission of a desired RF transmit field to the object for magnetic resonance spin excitation of the object, wherein each coil is associated with a physical transmit channel, wherein the RF transmit field corresponds to a virtual arrangement of two or more of said coils, wherein virtual transmit channel properties comprising virtual transmit channel weights are assigned to the RF transmit field, said virtual transmit channel weights describing the virtual complex RF field amplitudes with respect to each individual coil of the virtual coil arrangement required to be applied to the physical coils for generating the RF transmit field, the emulation system being adapted for:
  a) receiving the virtual transmit channel properties from the MR system,
  b) transforming the virtual transmit channel properties using a channel encoding matrix, the transmit channel encoding matrix describing a transformation of the virtual transmit channel properties of the virtual coil arrangement to physical transmit channel properties of the physical coil arrangement,
  c) receiving optimized virtual transmit channel properties, the optimized virtual transmit channel properties being received from the MR system and resulting from
    i. measuring by the MR system individual virtual coil sensitivities of the two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity,
    ii. optimizing by the MR system the individual virtual transmit channel properties for each virtual coil using the measured virtual coil sensitivities resulting in the desired RF transmit field at higher accuracy,
  d) transforming the optimized virtual transmit channel properties using the channel encoding matrix, said transformation resulting in physical transmit channel properties comprising physical transmit channel weights, said physical transmit channel weights describing the physical complex RF field amplitudes with respect to each individual coil of the physical coil arrangement,
  e) providing the physical transmit channel properties to the MR system for performing the magnetic resonance imaging scan using the physical transmit channel properties.

14. A non-transitory computer-readable medium carrying computer executable instructions configured to control one or more computer processors to:
  transform the virtual transmit channel properties using a channel encoding matrix, the transmit channel encoding matrix describing a transformation of a virtual transmit channel properties of a virtual coil arrangement to physical transmit channel properties of a physical magnetic resonance coil arrangement;
  determine individual virtual coil sensitivities of two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity;
  optimize the individual virtual transmit channel properties for each virtual coil using the determined virtual coil sensitivities resulting in an accurate RF transmit field;
  transform the optimized virtual transmit channel properties using the channel encoding matrix, the transformation resulting in physical transmit channel properties including physical transmit channel weights, the physical transmit channel weights describing physical complex RF field amplitudes with respect to each individual coil of the physical coil arrangement.

15. The non-transitory computer-readable medium of claim 14, wherein the computer executable instructions further control an MR system to perform a magnetic resonance imaging scan using the physical transmit channel properties.

16. The non-transitory computer-readable medium of claim 15 in combination with one or more computer processors, wherein the computer executable instructions are configured to control the one or more computer processors to reconstruct magnetic resonance signals generated during the scan into a diagnostic image.

17. The non-transitory computer-readable medium of claim 16, further in combination with:
a main magnet for generating a $B_0$ field through an examination region;
a set of transmit coils configured to transmit RF pulses into the examination region to excite magnetic resonance in an examined object;
a multi-channel transmitter, each transmit coil being connected with one of the channels of the transmitter; and
one or more computer processors configured to execute the computer executable instructions.

18. A magnetic resonance system comprising:
one or more processors configured to:
transform the virtual transmit channel properties using a channel encoding matrix, the transmit channel encoding matrix describing a transformation of a virtual transmit channel properties of a virtual coil arrangement to physical transmit channel properties of a physical magnetic resonance coil arrangement;
determine individual virtual coil sensitivities of two or more virtual coils using the respective transformed individual virtual transmit channel property for each virtual coil, wherein the RF transmit field of each individual virtual coil is given by the combination of the corresponding virtual transmit channel property and the corresponding virtual coil sensitivity;
optimize the individual virtual transmit channel properties for each virtual coil using the determined virtual coil sensitivities resulting in an accurate RF transmit field;
transform the optimized virtual transmit channel properties using the channel encoding matrix, the transformation resulting in physical transmit channel properties including physical transmit channel weights, the physical transmit channel weights describing physical complex RF field amplitudes with respect to each individual coil of the physical coil arrangement.

19. The magnetic resonance system according to claim 18, further including:
a main magnet for generating a $B_0$ field through an examination region;
RF coils configured to transmit RF pulses into the examination region and receive magnetic resonance signals from the examination region;
a multi-channel transmitter, each transmit coil being connected with one of the channels of the transmitter;
a receiver configured to receive the magnetic resonance signals;
a reconstruction processor configured to reconstruct the received magnetic resonance signals into an image representation.

20. The magnetic resonance system according to claim 19, further including:
a video monitor configured to display the reconstructed image representations.

* * * * *